United States Patent
Yamamoto et al.

(10) Patent No.: US 7,943,235 B2
(45) Date of Patent: May 17, 2011

(54) ADHESIVE SHEET FOR PROCESSING SEMICONDUCTOR SUBSTRATES

(75) Inventors: Akiyoshi Yamamoto, Ibaraki (JP); Toshio Shintani, Ibaraki (JP); Fumiteru Asai, Ibaraki (JP); Kouichi Hashimoto, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/969,023

(22) Filed: Jan. 3, 2008

(65) Prior Publication Data
US 2008/0261038 A1 Oct. 23, 2008

(30) Foreign Application Priority Data
Jan. 5, 2007 (JP) .................. 2007-000359

(51) Int. Cl.
*B32B 7/12* (2006.01)
*B32B 15/04* (2006.01)
*C08L 33/06* (2006.01)
*C09B 67/00* (2006.01)

(52) U.S. Cl. .............. 428/355 R; 428/343; 428/355 BL; 428/355 AC; 524/560

(58) Field of Classification Search .................. 428/343, 428/355 R, 355 BL, 355 AC; 524/560
See application file for complete search history.

(56) References Cited

U.S. PATENT DOCUMENTS

| 4,756,968 A | | 7/1988 | Ebe et al. | |
| 5,356,949 A | * | 10/1994 | Komiyama et al. | 522/102 |
| 7,084,516 B2 | * | 8/2006 | Takei et al. | 257/783 |

FOREIGN PATENT DOCUMENTS

| EP | 0 622 833 | | 11/1994 |
| EP | 1 854 856 | A1 | 11/2007 |
| EP | 1 880 843 | A1 | 1/2008 |
| JP | 62-153376 | | 7/1987 |
| JP | 06-049420 | | 2/1994 |
| JP | 06-188310 | A | 7/1994 |
| JP | 07-045557 | A | 2/1995 |
| JP | 07-086212 | A | 3/1995 |
| JP | 09-132763 | A | 5/1997 |
| JP | 10-214800 | A | 8/1998 |
| JP | 2002-158276 | A | 5/2002 |
| JP | 2002-226796 | A | 8/2002 |
| JP | 2004-119780 | A | 5/2004 |
| WO | 00/24839 | | 5/2000 |

OTHER PUBLICATIONS

Satas, Donatas. "The Handbook of Pressure Sensitive Adhesive Technology," 1999, Satas & Associates, p. 484.*
Japanese Office Action corresponding to JP 2007-000359, mailed Feb. 8, 2011.

* cited by examiner

*Primary Examiner* — Callie E Shosho
*Assistant Examiner* — Nicholas Kokkinos
(74) *Attorney, Agent, or Firm* — Sughrue Mion, PLLC

(57) ABSTRACT

An adhesive sheet for processing semiconductor substrates comprises a UV rays- and/or radiation-transmittable base film and an adhesive layer that undergoes a polymerization curing reaction by means of UV rays and/or radiation, wherein the adhesive layer is formed using a multifunctional acrylate oligomer and/or monomer having a double bond, and is blended so as to result in 1 double bond per total average molecular weight of 225 to 8000 as determined on the basis of the weight average molecular weight of the multifunctional acrylate oligomer and/or monomer.

5 Claims, No Drawings

ADHESIVE SHEET FOR PROCESSING SEMICONDUCTOR SUBSTRATES

BACKGROUND OF THE INVENTION

1. Field of the Invention

The present invention relates to an adhesive sheet for processing semiconductor substrates, and more particularly to an adhesive sheet for processing semiconductor substrates comprising a base film and an adhesive layer containing specific ingredients.

2. Background Information

An adhesive sheet for processing semiconductor wafers and/or substrates are conventionally used to secure semiconductor wafers and/or substrates when the semiconductor wafers and/or substrates are diced and expanded, and the semiconductor wafers and/or substrates are then picked up and simultaneously mounted.

In this type of sheet, a UV- and/or radiation-transmittable base film is coated with an adhesive layer that undergoes a polymerization curing reaction by means of UV rays and/or radiation, and the adhesive layer is irradiated with UV rays and/or radiation after the dicing process, causing the adhesive layer to undergo a polymerization curing reaction, whereby the adhesive strength is reduced, allowing the individual pieces such as the semiconductor wafers, chips, or substrates to be picked up.

An adhesive sheet for semiconductor wafer processing has been proposed as this type of sheet, for example, the adhesive layer comprises a base polymer, a multifunctional urethane acrylate having a molecular weight of 15,000 to 50,000, a polyester plasticizer, and a photopolymerization initiator, where the photopolymerization initiator is included in a proportion of 1 to 50 weight parts per 100 weight parts base polymer (see Japanese Laid-Open Patent Application H06-49420, for example). The use of multifunctional urethane acrylate oligomers having a molecular weight of about 3,000 to 10,000 for the adhesive layer has also been proposed (see Japanese Laid-Open Patent Application S62-153376, for example).

Recent trends in environmentally concerned commercialization, however, have led to the adoption of halogen-free flame retardants and the use of stabilizers based on different types of metal soaps than in the past as additives, and to the use of resins, in conjunction with the above, that are different in terms of type, composition, and the like than those used thus far, to maintain the properties of the sealing resin.

Additionally, the individual pieces sometimes cannot be picked up in the pick up process if the adhesive strength of the adhesive layer has not been lowered to the desired level after UV irradiation in cases where the sealing resin and/or additives are not suitable for the adherends or the amount of the release agent (such as wax) that is generally applied to the sealing resin surface is insufficient or irregular, or the like. Forcibly picking up the pieces may result in separation in the interior of the sealing resin or a sticky residue over the entire surface of the sealing resin.

SUMMARY OF THE INVENTION

In view of the foregoing, an object of the present invention is to provide a consistent decrease in adhesive strength after irradiation with UV rays and/or radiation, leaving no adhesive residue whatsoever, regardless of the resin compositions of semiconductor devices or the like, the type of additive, type of release agent, or amount thereof.

Adhesive sheets featuring the use of a multifunctional acrylate oligomer and/or monomer in the adhesive layer have thus far been selected in view of the decrease in their adhesive strength after an adherend such as a common semiconductor wafer and the like has been irradiated with UV rays and/or radiation. They are not selected upon testing and confirmation that they can be used with all manner of a broad range of adherends, including green sealing resin. For practical purposes, it is not feasible to design adhesive sheets by actually testing the various types of adherends which may conceivably be used.

On the other hand, when commonly used adhesive sheets are employed, drawbacks such as adhesive residue on the resin surface may often occur depending on modifications of the resin composition in the adherend, the presence or absence of additives, and the type and amount of release agent. Certain individual adhesive sheets can therefore be used only with certain limited types of sealing resin, resulting in manufacturing limitations and drawbacks such as the use of different types of adhesive sheets.

As a result of extensive research, the inventors found by precise analysis that reactive groups of phosphorous compounds, cyan compounds or the like are present on the surface of many adherends that tend to result in such drawbacks, and determined that these reactive groups or chemical bonds chemically interact with the adhesive components in the adhesive layer, causing drawbacks such as adhesive residue. The present invention was perfected upon the unexpected determination that the problem of adhesive residue could be improved and that consistent adhesive strength needed for the pick up process after UV rays and/or radiation could simultaneously be ensured, even with adherends that tend to result in the drawbacks described above, by forming the adhesive layer using multifunctional acrylate oligomer and/or monomer having a number of double bonds within a certain range, so as to prevent such reactive groups and chemical bonds from chemically interacting with adhesive components.

The present invention provides an adhesive sheet for processing semiconductor substrates comprising a UV rays- and/or radiation-transmittable base film and an adhesive layer that undergoes a polymerization curing reaction by means of UV rays and/or radiation, wherein the adhesive layer is formed using a multifunctional acrylate oligomer and/or monomer having a double bond, and is blended so as to result in 1 double bond per total average molecular weight of 225 to 8000 as determined on the basis of the weight average molecular weight of the multifunctional acrylate oligomer and/or monomer.

After UV rays and/or radiation, the adhesive sheet for processing semiconductor substrate of the invention exhibits a consistent decrease in adhesive strength for a broad range of semiconductor substrate processing resins, regardless of the composition of the sealing resin in adherends such as semiconductor substrates, the presence or absence of additives, or the type and amount of release agent. It is thereby possible to provide a consistent adhesive sheet in which drawbacks in the subsequent pick up process and adhesive residue on the resin surface can be almost completely prevented.

The adhesive sheet of the present invention can be utilized in a wide range of any kinds of applications such that it is applied to semiconductor wafers (such as silicon wafer, germanium wafer, gallium arsenide wafer), circuit boards, ceramic substrates, metal substrates, semiconductor packages and the like.

DETAILED DESCRIPTION OF THE PREFERRED EMBODIMENTS

The adhesive sheet for processing semiconductor substrates of the present invention mainly comprises a base film and an adhesive layer.

The base film used in the present invention is not particularly limited, provided that it may be UV- and/or radiation-transmittable. For example, the material may be at least partially transmittable to radiation such as IR rays, X-rays, and electron beams. The permeability may be at least about 75%, at least about 80%, and at least about 90%, for example. Examples of the base film include a film made of a polymer or the like, for example, polyester, such as polyvinyl chloride, polyvinylidene chloride, polyethylene terephthalate, polyamide, polyether ether ketone; polyolefins such as very low-density polyethylene, low-density polyethylene, liner polyethylene, medium-density polyethylene, high-density polyethylene, random copolypropylene, block copolypropylene, homopolypropylene, polybutene, polymethylpentene; polyurethane, ethylene-vinyl acetate copolymer, ionomer resin, ethylene-(meth)acrylic acid copolymer, ethylene-(meth)acrylic ester (random, alternating) copolymer, ethylene-butene copolymer, ethylene-hexene copolymer, fluorocarbon polymer, cellulosic resin or crosslinked polymer thereof. The base film may be either a single layer or a multi-layered structure of two or more layers. The thickness of the base film is generally 5 to 400 μm, preferably 20 to 300 μm.

The adhesive layer provided on the base film is composed of an adhesive with which a polymerization curing reaction can be brought about by UV rays and/or radiation, and is preferably formed using a multifunctional acrylate oligomer and/or monomer having double bonds.

The multifunctional acrylate oligomer and/or monomer is blended in such a way as to result in 1 double bond per total average molecular weight of 225 to 8000, and preferably 1 double bond per 225 to 7000, as determined on the basis of the weight average molecular weight. When the number of double bonds is within this range, the invention will be suitable for a broad range of adherends, and adhesive residue can be prevented. The intended adhesive curing and shrinkage after UV rays and/or radiation can also be achieved, the intended decrease in adhesive strength after irradiation can be achieved, and missed pick up in the subsequent pick up process can be prevented.

The multifunctional acrylate oligomer and/or monomer is preferably included, for example, in an amount of 10 to 180 weight parts per 100 weight parts base polymer. Within this range, the intended adhesive curing and shrinkage can be achieved as noted above, and changes over time in the composition caused by the proportion of oligomer in the adhesive layer can be prevented, allowing products with long-term stability to be obtained.

Examples of such multifunctional component include (meth)acrylate oligomers/monomers or the like.

Examples of that include hexanediol di(meth)acrylate, polyethylene glycol di(meth)acrylate, 1,4-butanediol(meth)acrylate, polypropylene glycol di(meth)acrylate, neopentylglycol di(meth)acrylate, pentaerythritol di(meth)acrylate, trimethylolpropane tri(meth)acrylate, pentaerythritol tetra(meth)acrylate, pentaerythritol tri(meth)acrylate, dipentaerythritol monohydroxy penta(meth)acrylate, dipentaerythritol hexa(meth)acrylate, epoxy(meth)acrylate, polyester (meth)acrylate, urethane (meth)acrylate or the like, and various oligomers such as urethane, polyether, polyester, polycarbonate, or polybutadiene oligomers/monomers are also included, preferably with a molecular weight in the range of about 100 to 30,000. These components can be used alone or as mixture of more than two components.

Urethane (meth)acrylate oligomers in particular may preferably have 2 to 4, and further 2 acryloyl groups per molecule. These oligomers can be produced, for example, by first reacting between a diisocyanate and polyol in a reactor kept at 60 to 90° C., and then adding a hydroxy (meth)acrylate after the conclusion of the reaction to bring about another reaction.

Examples of diisocyanate include toluene diisocyanate, diphenylmethane diisocyanate, hexamethylene diisocyanate, phenylene diisocyanate, dicyclohexylmethane diisocyanate, xylene diisocyanate, tetramethylxylene diisocyanate, naphthalene diisocyanate, or the like, for example.

Examples of polyol include ethylene glycol, propylene glycol, butanediol, hexanediol, or the like, for example.

Examples of hydroxy(meth)acrylate include 2-hydroxyethyl(meth)acrylate, 2-hydroxypropyl(meth)acrylate, or the like, for example.

These components can be used alone or as mixture of more than two components.

Examples of methods for ensuring 1 double bond per total average molecular weight of 225 to 8000, as determined on the basis of the weight average molecular weight, in the multifunctional acrylate oligomer and/or monomer include methods in which the following calculating formulas are used to suitably select and/or blend oligomers/monomers having a molecular weight per double bond within this range.

When one type of multifunctional oligomer and/or monomer is used $$M = (Mw/N_{dou}) \tag{1}$$

When two types of multifunctional oligomer and/or monomer (such as monomer M1 and oligomers O2) are blended $$M = (Mw \text{ of } M1/N_{dou} \text{ of } M1) \times (Wp \text{ of } M1/\text{total } Wp \text{ of } (M1 \text{ and } O2)) + (Mw \text{ of } O2/N_{dou} \text{ of } O2) \times (Wp \text{ of } O2/\text{total } Wp \text{ of } (M1 \text{ and } O2)) \tag{2}$$

wherein, M is the molecular weight relative to 1 double bond, Mw is the weight average molecular weight, $N_{dou}$ is the number of double bonds (number of functional groups), and Wp is the number of weight parts.

When three or more types of multifunctional oligomers and/or monomers are used, the calculations can be based on those for two types of multifunctional oligomer and/or monomer above.

A commonly used pressure-sensitive adhesive can be employed as the adhesive in the present invention, and may suitably include a compound with UV- and/or radiation-curable functional groups such as carbon-carbon double bonds as a base polymer. Conventionally known base polymers for use in adhesives can be selected as desired for use as the base polymer. Examples that are suitable for use include polymers such as acrylic polymers or elastomers, specifically, acrylic polymers obtained through the polymerization of (meth)acrylic acid or esters thereof and monomers or the like that are copolymerizable with (meth)acrylic acid or esters thereof, and polymers of natural or synthetic rubber or the like. A molecular weight is preferably 300,000 to 1,500,000, or 300,000 to 1,100,000. Setting the molecular weight within this range will eliminate cutting displacement when cut and will ensure good compatibility with the tackifier or other additives. Any well known base polymer such as those given in Japanese Patent 3797601 and the above Patent Citations 1 and 2 can be used.

Examples of the copolymerizable monomer constituting the base polymer include hydroxylalkyl esters of (meth)

acrylic acid such as hydroxyethyl ester, hydroxybutyl ester, hydroxyhexyl ester; glycidyl (meth)acrylate; monomers containing carboxylic group such as acrylic acid, methacrylic acid, carboxyethyl (meth)acrylate, carboxy pentyl (meth)acrylate, itaconic acid, maleic acid, fumaric acid, crotonic acid; acid anhydride monomers such as maleic anhydride, itaconic anhydride; (meth)acrylamide; (meth)acrylate N-hydroxymethylamide; (meth)acrylate alkylaminoalkylester such as dimethylaminoethyl methacrylate, t-butyl aminoethyl methacrylate; N-vinylpyrrolidone; acryloyl morpholine; vinyl acetate; styrene; acrylonitrile; N,N-dimethylacrylamide; monomers containing alkoxyl group at side chaine such as methoxyethyl (meth)acrylate, ethoxy (meth)acrylate; or the like. These components can be used alone or as mixture of more than two components.

Examples of elastomer used as the base polymer include natural rubbers, synthetic isoprene rubber, styrene-butadiene rubber, styrene-butadiene-styrene block copolymer, styrene-isoprene-styrene block copolymer, butyl rubber, polyisobutylene, polybutadiene, polyvinyl ether, silicone rubber, polyvinyl isobutyl ether, vinyl acetate polymer, chloroprene rubber, nitrile rubber, graft rubber, reclaimed rubber, styrene-ethylene-butylene block copolymer, styrene-propylene-butylene block copolymer, styrene-isoprene copolymer, acrylonitrile-butadiene copolymer, acrylonitrile-acrylate copolymer, methyl-methacrylate-butadiene copolymer, polyisobutylene-ethylene-propylene copolymer, ethylene-vinyl acetate copolymer, or acrylic rubber such as alkyl acrylate copolymer, alkyl acrylate-alkoxy alkyl acrylate copolymer, or the like.

A cross linker may be added as desired, particularly when an acrylic polymer is used as the base polymer in the present invention. Cross linkers can bring about three-dimensional cross linking of the base polymer, further enhancing the cohesive strength of the adhesive layer. Examples of the cross linker include any conventional compounds such as polyisocyanate compounds, polyglycidyl compounds, aziridine compounds, melamine compounds polyvalent metal chelate compounds. The proportion in which the cross linker is blended when added may be 0.01 to 10 weigh parts, preferably 0.03 to 7 weigh parts per 100 weight parts base polymer. Setting the proportion in which the cross linker is blended within this range will ensure cohesive as well as prevented contaminating the semiconductor substrates resulting from excessive cross linker.

The adhesive layer of the present invention may optionally comprise at least one conventional additive such as tackifiers, surfactants, softening agents, antioxidants, curing agents, fillers, UV absorbers, photostabilizers, (photo)polymerization initiators and the like. These additives can be used alone or as mixture of more than two components.

The tackifier may preferably have a hydroxyl value of 120 to 230 mg/g, more preferably 120 to 210 mg/g. Setting the hydroxyl value within this range will provide enough adhesion on the sealing resin before UV irradiation. The adhesive strength also can be lowered to the desired level after UV irradiation, regardless of the type of sealing resin or the like on the adhering surface of the adhesive sheet, or of the amount of the release agent added to or adhering to the resin surface.

Examples of the tackifier that include hydroxyl groups and have the specified hydroxyl value include terpene phenolic resins, rosin phenolic resins, alkylphenolic resins or the like.

Examples of the terpene phenolic resin include alpha-pinene-phenolic reisn, beta-pinene-phenolic reisn, diterpene-phenolic resin, terpenebisphenolic resin or the like. Because terpene phenolic resins can be used to achieve high compatibility with the base polymer, stable quality can be preserved over long periods of time, with virtually no changes in the adhesive tape during tape storage.

The tackifier usually has a lower molecular weight than the base polymer. For example, the molecular weight is in the tens of thousands or less, ten thousands or less, a few thousand or less.

The tackifier may be preferably used in an amount of 0.1 to 70 parts, and 1 to 50 parts per 100 (weight) parts base polymer. This will result in less of an increase in the adhesive strength, as well as ensuring storage stability of the adhesive sheet, and obtaining long-term stability.

Any ionic or nonionic surfactant can be used. Examples of the surfactant include ester-types, ether types, polyoxyethylene alkyl ethers, polyoxyethylene alkyl phenyl ethers, polyethyleneglycols, carboxylic-types, sulfonic-types, amino acid-types, amine-types or the like. From the standpoint of compatibility, a molecular weight of no more than 2000, and no more than 1500 is preferred. However, this limit does no apply when the molecular structure has good affinity for adhesives. Antistatic effects can be provided, particularly when quaternary ammonium salts are used. These can be single types alone or mixtures of two or more.

Among these, ester types are preferred, that is, those including ester compounds or derivatives thereof, preferably with a carbon number of 10 or more. It is possible to both prevent flick and achieve good pick up of adherends with low amounts of a release agent on the surface. Further, ester compounds with an alkyl group of a carbon number of 15 or more are preferred. If the carbon number of the alkyl groups of the compounds is within the above range, the adhesives containing them can be lowered initial adhesive strength. The maximum carbon number is substantially about 50 to 60 in the interests of industrial availability, molecular weight distribution, heat resistance (that is, a maximum melting point of about 110° C.), and the like. The melting point of such ester compounds may be preferably at least 40° C. to ensure stability during long-term storage at elevated temperatures. As a result, the adhesive properties will be prevented from increasing even when sheets involving the use of the adhesive composition of the invention as the adhesive layer are applied to adherends and stored for long periods of time at elevated temperatures.

Examples of such ester compound include ester compounds (monoesters, diesters, triesters, or the like) of higher alcohols with alkyl groups having a carbon number of at least 10, and preferably at least 15, and acids such as a carboxylic acid, sulfuric acid, sulfurous acid, phosphoric acid, phosphorous acid, or the like. Among these, monoesters, diesters, or trimesters of higher alcohols and phosphoric acid are preferably used. Examples of the higher alcohol include stearyl alcohol (carbon number: 18), 1-docosanol (carbon number: 22), 1-tetracosanol (carbon number: 24), 1-hexacosanol (carbon number: 26), 1-octacosanol (carbon number: 28), 1-nonacosanol (carbon number: 29), myricyl alcohol (carbon number: 30), hentriacontanol (carbon number: 31), lacceryl alcohol (carbon number: 32), cellomelissyl alcohol (carbon number: 33), 1-tetratriacontanol (carbon number: 34), 1-pentatriacontanol (carbon number: 35), 1-heptatriacontanol (carbon number: 36), 1-tetratetracontanol (carbon number: 44), and the like, for example. Examples of the acid include monocarboxylic acid such as formic acid, acetic acid, benzoic acid; polycarboxylic acid such as oxalic acid, succinic acid, tricarballylic acid, and the like.

Ester compounds of higher alcohols can be produced by heating a higher alcohol and an acid such as a carboxylic acid, sulfuric acid, sulfurous acid, phosphoric acid, or phosphorous acid to reflux in the presence of an acid catalyst such as hydrochloric acid in an organic solvent, and dehydrating the water that is produced. Ester compounds of alcohols and carboxylic acids having alkyl groups with a carbon number of at least 10, and preferably at least 15, can also be used as ester compounds or derivatives thereof.

Other types of commercially available surfactants that will not cause contamination during the semiconductor process can also be selected as desired for use.

In the present invention, the surfactant such as the ester compound or derivative thereof may be blended in an amount of 0.02 to 8 weight parts, and more preferably 0.05 to 2 weight parts, per 100 weight parts base polymer. Within this range, substantial effects can be expected when the surfactant is added, as well as an initial adhesive strength before UV irradiation can be ensured. Also, it can ensure the compatibility with the adhesive, which may result in preventing contamination of the adherend surface after being removed.

Examples of the softening agent include plasticizer, polybutene, liquid tackifier resins, polyisobutylene lower polymer, polyvinyl isobutyl ether lower polymer, lanolin, depolymerization rubber, processing oil, vulcanized oil or the like, for example.

Examples of the antioxidant include phenol antioxidant such as 2,6-di tert-butyl-4-methylphenol, 1,1-bis-(4-hydroxyphenol) cyclohexane; amine antioxidant such as phenyl β-naphthylamine; benzimidazole antioxidant such as mercaptbenzimidazole; 2,5-di tert-butylhydroquinone, or the like.

Examples of the curing agent for the rubber adhesive include isocyanate, sulfur-curable and vulcanization accelerator, polyalkylphenol, organic peroxide, or the like. Examples of the isocyanate include phenylene diisocyanate, tolylene diisocyanate, diphenylmetha diisocyanate, hexamethylene diisocyanate, cyclohexane diisocyanate, or the like. Examples of the sulfur-curable and vulcanization accelerator include thiazole rubber accelerator, sulfenic amide rubber accelerator, thiuram rubber accelerator, dithioate rubber accelerator, or the like. Examples of the polyalkylphenol include butyl phenol, octyl phenol, nonyl phenol, or the like. Examples of the organic peroxide include dichromyl peroxide, ketone peroxide, peroxy ketal, hydroperoxide, dialkyl peroxide, peroxyester, peroxy dicarbonate, or the like.

Examples of the filler include hydrozincite, titanium oxide, silica, aluminium hydroxide, calcium carbonate, barium sulfate, starch, clay, talc, or the like.

The photopolymerization initiator is excited and activated by the irradiation of ultraviolet rays, and generates radicals, thereby curing polyfunctional oligomers by radical polymerization. Examples of the photopolymerization initiator include acetophenone compounds such as 4-phenoxy dichloroacetophenon, 4-t-butyl dichloroacetophenon, diethoxyacetophenon, 2-hydroxy-2-methyl- 1-phenyl puropane-1-one, 1-(4-isopropylphenyl)-2-hydroxy-2-methylpropane-1-one, 1-(4-dodecylphenyl)-2-hydroxy-2-methylpropane-1-one, 4-(2-hydroxyethoxy) phenyl-(2-hydroxy-2-propyl) ketone, 1-hydroxycyclohexyl phenyl ketone, 2-methyl-1-[4-(methyltio)phenyl]-2-morpholinoprophane-1, 2,2-dimethoxy-2-phenylacetophenon; benzoine compounds such as benzoine, benzoine methylether, benzoine ethylether, benzoine isopropylether, benzoine isobutylether; benzophenone compounds such as benzophenone, benzoylbenzoate, benzoyl methyl benzoate, 4-phenyl benzophenone, hydroxyl benzophenone, 4-benzoyl-4'-methyldiphenyl sulfide, 3,3'-dimethyl-4-methoxybenzophenone; thioxanthone compounds such as thioxanthone, 2-chlorthioxanthone, 2-methylthioxanthone, 2,4-dimethyl thioxanthone, isopropyl thioxanthone, 2,4-dichloro thioxanthone, 2,4-diethyl thioxanthone, 2,4-diisopuropyl thioxanthone; specific photopolymerization initiator such as α-acyloxym ester, acyl phosphine oxide, methylphenyl glyoxylate, benzil, camphorchinone, dibenzosuberone, 2-ethyl anthraquinone, 4',4''-diethlisophthalophenone, and the like The photopolymerization initiator may be blended in a proportion of 0.1 to 15 weight parts per 100 weight parts base polymer. This proportion being within this range makes it possible to ensure curing multifunctional oligomers or monomers with UV rays and/or radiation, obtaining excellent adhesive and heat or fluorescent light stability.

Examples of the polymerization initiator include peroxides such as hydrogen peroxide, benzoyl peroxide, t-butyl peroxide, or the like. One may be preferably used by itself, or it may be combined with a reducing agent and used as a redox type of polymerization initiator. Examples of the reducing agent include ionic salts such as salts of iron, copper, cobalt, sulfite, bisulfite; amines such as triethanol amine; reducing sugar such as aldose, ketose, or the like. Also, azo compounds such as 2,2'-azobis-2-methylpropioamidine salt, 2,2'-azobis-2,4-dimethylvaleronitrile, 2,2'-azobis-N,N'-dimethyleneisobutylamidine salt, 2,2'-azobisisobutyronitrile, 2,2'-azobis-2-methyl-N-(2-hydroxyethyl) propionamide may be used. These can be used alone or as mixture of more than two components.

Examples of method for forming the adhesive layer on a base film to produce an adhesive sheet for processing semiconductor wafers or semiconductor substrates include methods in which the components forming the adhesive layer are dissolved as such or by a suitable organic solvent, applied onto the base film by being coated, dispersed, or the like, and dried by a heat treatment or the like for 30 seconds to 10 minutes at 80 to 100° C.

The thickness of the adhesive layer in the present adhesive sheet is suitable about 3 to 150 μm, and preferable about 3 to 100 μm, 5 to 100 μm. This thickness being within this range makes it possible to favorably conform to the adhering surface texture of the adherends with large surface roughness, which results in increasing contact area and preventing chip fly when cut, and to lower the cost of production.

The adhesive sheet for processing semiconductor substrates in the present invention can be employed in commonly used methods. For example, semiconductor substrates may be applied and secured on the adhesive sheet of the present invention, and the semiconductor substrates may then be cut into element pieces (chips) by a rotating circular blade. The pieces are then irradiated with UV rays and/or radiation through the base film side of the adhesive sheet, the adhesive sheet is then radially expanded using a special tool, widening the gaps between the element pieces (chips) to regular intervals, the element pieces (chips) are then poked out by needles or the like, and they are adsorbed or the like by an air pin set or the like, so as to be picked up and simultaneously mounted.

The adhesive sheet of the invention can also be used for a variety of adherends, such as semiconductor wafers, semiconductor substrates, and sealed resin substrates in which one or more chips or the like are individually or integrally sealed with leads and sealing resin or the like. The adherend that is attached is not limited to semiconductors but can be a variety of materials, that is inorganics such as metal, plastic, glass, ceramics, or the like.

The adhesive sheet of the invention is particularly suitable for use with objects such as those with phosphorous compounds, cyan compounds or other reactive group.

The adhesive sheet of the present invention is illustrated in greater detail by, but is not limited to, the following examples and comparative examples. The molecular weight of the multifunctional acrylate oligomer and/or monomer with 1 double bond is calculated by the above formula (1) or (2).

EXAMPLE 1

100 weight parts copolymer (35% of solid content) having weight-average molecular weight of 700000 and copolymerized by methyl acrylate/acrylic acid/2-ethylhexyl acrylate at weight ratio of 40/10/50;

140 weight parts multifunctional acrylate oligomer (SHIKOH UV-3000B, made by Nippon Gohsei, weight-average molecular weight of 18000, two of double bonds) and 40 weight parts SHIKOH UV-1700B, made by Nippon Gohsei, weight-average molecular weight of 2000, ten of double bonds (molecular weight per one double bond in the prepared multifunctional acrylate oligomer solution: 7044);

20 weight parts terpene phenolic resin (YS polyster-N125, made by Yasuhara Chemical Co., Ltd.) as a tackifier, 0.08 weight parts melamine compound (J-820-60N, made by Dainippon ink and chemicals Inc.) as a cross linker, and 5 weight parts photopolymerization initiator (Irgacure 651, made by Ciba Specialty Chemicals)

was mixed to prepare a resin solution to be an adhesive layer.

The resin solution was applied to a dry thickness of 20 μm on a 38 μm thick polyester film which had undergone silicone release treatment, and was dried for 5 minutes at 150° C.

The 150 μm polyethylene film serving as the base film was then laminated, giving a semiconductor processing sheet.

The resulting semiconductor substrate processing sheet was aged for at least 4 days at 50° C., and was evaluated in the following manner. The results are given in Table 1.

EXAMPLE 2

An adhesive sheet was prepared in the same manner as in Example 1 except that the adhesive composition was prepared adding 180 weight parts multifunctional acrylate oligomer (SHIKOH UV-7600B, made by Nippon Gohsei, weight-average molecular weight of 1400, six of double bonds) (molecular weight per one double bond in the prepared multifunctional acrylate oligomer solution: 233). The sheet was evaluated in the following manner.

EXAMPLE 3

An adhesive sheet was prepared in the same manner as in Example 2 except that the adhesive composition was prepared changing to 10 weight parts multifunctional acrylate oligomer (SHIKOH UV-7600B). The sheet was evaluated in the following manner.

EXAMPLE 4

An adhesive sheet was prepared in the same manner as in Example 1 except that the adhesive composition was prepared adding 7.78 weight parts multifunctional acrylate oligomer (SHIKOH UV-3000B, made by Nippon Gohsei, weight-average molecular weight of 18000, two of double bonds) and 2.2 weight parts SHIKOH UV-1700B (weight-average molecular weight: 2000, ten of double bonds) (molecular weight per one double bond in the prepared multifunctional acrylate oligomer solution: 7046). The sheet was evaluated in the following manner.

EXAMPLE 5

An adhesive sheet was prepared in the same manner as in Example 2 except that the adhesive composition was prepared adding 110 weight part multifunctional acrylate oligomer (SHIKOH UV-2000B, made by Nippon Gohsei, weight-average molecular weight of 13000, two of double bonds) (molecular weight per one double bond in the prepared multifunctional acrylate oligomer solution: 6500) instead of the multifunctional acrylate oligomer SHIKOH UV-7600B. The sheet was evaluated in the following manner.

EXAMPLE 6

An adhesive sheet was prepared in the same manner as in Example 2 except that the adhesive composition was prepared using 80 weight part multifunctional acrylate oligomer (SHIKOH UV-6300B, made by Nippon Gohsei, weight-average molecular weight of 3700, seven of double bonds) (molecular weight per one double bond in the prepared multifunctional acrylate oligomer solution: 528) instead of the multifunctional acrylate oligomer SHIKOH UV-7600B. The sheet was evaluated in the following manner.

EXAMPLE 7

An adhesive sheet was prepared in the same manner as in Example 1 except that the adhesive composition was prepared adding 163.3 weight parts multifunctional acrylate oligomer (SHIKOH UV-3000B, made by Nippon Gohsei, weight-average molecular weight of 18000, two of double bonds) and 46.7 weight parts UV-1700B (weight-average molecular weight: 2000, ten of double bonds) (molecular weight per one double bond in the prepared multifunctional acrylate oligomer solution: 7043). The sheet was evaluated in the following manner.

EXAMPLE 8

An adhesive sheet was prepared in the same manner as in Example 2 except that the adhesive composition was prepared changing to 210 weight parts multifunctional acrylate oligomer of SHIKOH UV-7600B. The sheet was evaluated in the following manner.

EXAMPLE 9

An adhesive sheet was prepared in the same manner as in Example 1 except that the adhesive composition was prepared adding 30 weight parts multifunctional acrylate oligomer (SHIKOH UV-1700B, weight-average molecular weight: 2000, ten of double bonds) and 150 weight parts SHIKOH UV-7600B (weight-average molecular weight: 1400, six of double bonds) (molecular weight per one double bond in the prepared multifunctional acrylate oligomer solution: 228). The sheet was evaluated in the following manner.

EXAMPLE 10

An adhesive sheet was prepared in the same manner as in Example 9 except that the adhesive composition was prepared adding 1.6 weight parts multifunctional acrylate oligomer (SHIKOH UV-1700B, weight-average molecular weight: 2000, ten of double bonds) and 8.3 weight parts SHIKOH UV-7600B (weight-average molecular weight: 1400, six of double bonds) (molecular weight per one double bond in the prepared multifunctional acrylate oligomer solution: 225). The sheet was evaluated in the following manner.

EXAMPLE 11

An adhesive sheet was prepared in the same manner as in Example 2 except that the adhesive composition was prepared changing to 8 weight parts multifunctional acrylate oligomer of SHIKOH UV-7600B. The sheet was evaluated in the following manner.

EXAMPLE 12

An adhesive sheet was prepared in the same manner as in Example 1 except that the adhesive composition was prepared adding 6.2 weight parts multifunctional acrylate oligomer (SHIKOH UV-3000B, made by Nippon Gohsei, weight-average molecular weight of 18000, two of double bonds) and 1.8 weight parts SHIKOH UV-1700B (weight-average molecular weight: 2000, ten of double bonds) (molecular weight per one double bond in the prepared multifunctional acrylate oligomer solution: 7020). The sheet was evaluated in the following manner.

EXAMPLE 13

An adhesive sheet was prepared in the same manner as in Example 1 except that the adhesive composition was prepared adding 7 weight parts multifunctional acrylate oligomer (SHIKOH UV-3000B, made by Nippon Gohsei, weight-average molecular weight of 18000, two of double bonds) and 1 weight parts SHIKOH UV-1700B (weight-average molecular weight: 2000, ten of double bonds) (molecular weight per one double bond in the prepared multifunctional acrylate oligomer solution: 7900). The sheet was evaluated in the following manner.

EXAMPLE 14

An adhesive sheet was prepared in the same manner as in Example 1 except that the adhesive composition was prepared adding 157.5 weight parts multifunctional acrylate oligomer (SHIKOH UV-3000B, made by Nippon Gohsei, weight-average molecular weight of 18000, two of double bonds) and 22.5 weight parts SHIKOH UV-1700B (weight-average molecular weight: 2000, ten of double bonds) (molecular weight per one double bond in the prepared multifunctional acrylate oligomer solution: 7900). The sheet was evaluated in the following manner.

EXAMPLE 15

An adhesive sheet was prepared in the same manner as in Example 1 except that the adhesive composition was prepared adding 186.6 weight parts multifunctional acrylate oligomer (SHIKOH UV-3000B, made by Nippon Gohsei, weight-average molecular weight of 18000, two of double bonds) and 53.4 weight parts SHIKOH UV-1700B (weight-average molecular weight: 2000, ten of double bonds) (molecular weight per one double bond in the prepared multifunctional acrylate oligomer solution: 7042). The sheet was evaluated in the following manner.

EXAMPLE 16

An adhesive sheet was prepared in the same manner as in Example 1 except that the adhesive composition was prepared adding 3.9 weight parts multifunctional acrylate oligomer (SHIKOH UV-3000B, made by Nippon Gohsei, weight-average molecular weight of 18000, two of double bonds) and 1.1 weight parts SHIKOH UV-1700B (weight-average molecular weight: 2000, ten of double bonds) (molecular weight per one double bond in the prepared multifunctional acrylate oligomer solution: 7066). The sheet was evaluated in the following manner.

COMPARATIVE EXAMPLE 1

An adhesive sheet was prepared in the same manner as in Example 2 except that the adhesive composition was prepared changing to 240 weight parts SHIKHO UV-7600B of Example 2. The sheet was evaluated in the following manner.

COMPARATIVE EXAMPLE 2

An adhesive sheet was prepared in the same manner as in Example 1 except that the adhesive composition was prepared adding 90 weight parts multifunctional acrylate oligomer (SHIKOH UV-1700B, made by Nippon Gohsei, weight-average molecular weight of 2000, ten of double bonds) and 90 weight parts SHIKOH UV-7600B (weight-average molecular weight: 1400, six of double bonds) (molecular weight per one double bond in the prepared multifunctional acrylate oligomer solution: 217). The sheet was evaluated in the following manner.

COMPARATIVE EXAMPLE 3

An adhesive sheet was prepared in the same manner as in Example 1 except that the adhesive composition was prepared adding 5 weight parts multifunctional acrylate oligomer (SHIKOH UV-1700B, made by Nippon Gohsei, weight-average molecular weight of 2000, ten of double bonds) and 5 weight parts SHIKOH UV-7600B (weight-average molecular weight: 1400, six of double bonds) (molecular weight per one double bond in the prepared multifunctional acrylate oligomer solution: 217). The sheet was evaluated in the following manner.

COMPARATIVE EXAMPLE 4

An adhesive sheet was prepared in the same manner as in Example 2 except that the adhesive composition was prepared changing to 5 weight parts SHIKOH UV-7600B of Example 2. The sheet was evaluated in the following manner.

COMPARATIVE EXAMPLE 5

An adhesive sheet was prepared in the same manner as in Example 1 except that the adhesive composition was prepared adding 240 weight parts multifunctional acrylate oligomer (SHIKOH UV-3000B, made by Nippon Gohsei, weight-average molecular weight of 18000, two of double bonds) (molecular weight per one double bond in the prepared multifunctional acrylate oligomer solution: 9000). The sheet was evaluated in the following manner.

COMPARATIVE EXAMPLE 6

An adhesive sheet was prepared in the same manner as in Example 1 except that the adhesive composition was prepared adding 180 weight parts multifunctional acrylate oligomer (UV-3000B, made by Nippon Gohsei, weight-average molecular weight of 18000, two of double bonds) (molecular weight per one double bond in the prepared multifunctional acrylate oligomer solution: 9000). The sheet was evaluated in the following manner.

COMPARATIVE EXAMPLE 7

An adhesive sheet was prepared in the same manner as in Example 1 except that the adhesive composition was prepared adding 5 weight parts multifunctional acrylate oligomer (SHIKOH UV-3000B, made by Nippon Gohsei, weight-average molecular weight of 18000, two of double bonds) (molecular weight per one double bond in the prepared multifunctional acrylate oligomer solution: 9000). The sheet was evaluated in the following manner.

COMPARATIVE EXAMPLE 8

An adhesive sheet was prepared in the same manner as in Example 1 except that the adhesive composition was prepared adding 100 weight parts multifunctional acrylate oligomer (SHIKOH UV-1700B, made by Nippon Gohsei, weight-average molecular weight of 2000, ten of double bonds) (molecular weight per one double bond in the prepared multifunctional acrylate oligomer solution: 200) instead of SHIKOH UV-3000B. The sheet was evaluated in the following manner.

COMPARATIVE EXAMPLE 9

An adhesive sheet was prepared in the same manner as in Example 1 except that the adhesive composition was prepared adding 110 weight parts multifunctional acrylate oligomer (NK ester 4G, made by Shin-nakamura Chemical Co., Ltd., weight-average molecular weight of 330, four of double bonds) (molecular weight per one double bond in the prepared multifunctional acrylate oligomer solution: 83) instead of SHIKOH UV-1700B. The sheet was evaluated in the following manner.

Application of Tape

The adhesive sheets prepared in the examples and comparative examples were applied at a speed of 20 mm/sec and a table temperature of 55° C. using a Nitto Seiki M-286N applicator to the sealed resin surface of substrates in which semiconductor chips had been embedded (laser printed to a depth of 15 μm in the resin surface, Chip Size: 5 mm square).

Evaluation of the Presence or Absence of the Adhesive Residue

The adhesive layer and base film were cut to a cut depth of 90 μm using a DISCO DFG-651 dicer and a resin blade with a blade speed of 38,000 rpm and a blade thickness of 300 μm under conditions involving a speed of 40 mm/sec and a cutting water quantity of 1.5 L/min. Thereafter, UV irradiation was performed using UV irradiation equipment (Nitto UM-810) with luminous flux density of 30 mW/cm$^2$ and cumulative light quantity of 500 mJ/cm$^2$ to the adhesive layer, and the chips were then manually released using tweezers. The 5000 chips were checked for adhesive residue on the chip surface using optical microscope.

Confirmation of Releasability

The chips were checked for confirmation of releasability after UV irradiation as the above using tweezers. Releasability with tweezers was double circles (⊚), heavyish releasability was rated circle (O), hard releasability with conventional die bonder was rated x. The 5000 chips were checked for confirmation of releasability.

Confirmation of Adhesive Strength Stability

The stability of the adhesive layer over time was checked in the following manner.

Specifically, assuming an initial value of 100%, after samples had been stored for 1 week at 60° C., 1 week at 40° C. and RH 92%, and 1 week at 10° C., those in which all results for adhesive strength were 100±20% were rated as having good stability (double circles), and those in which even one parameter was lower than 80%, or more than 120% were rated as having poor stability (x).

The results are shown in Table 1 and Table 2.

TABLE 1

| | Examples | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| MW/C═C | 7044 | 233 | 233 | 7046 | 6500 | 528 | 7043 | 7043 | 225 | 228 | 233 | 7020 | 7900 | 7900 | 7042 | 7066 |
| Adhesive residue | none | none | none | none | none | none | none | none | 0.8% | 0.5% | none | none | none | none | none | none |
| Releasability | ⊚ | ⊚ | ⊚ | ⊚ | ⊚ | ⊚ | ⊚ | ⊚ | O | O | O | O | O | O | ⊚ | (O) |
| Adhesive Strength Stability | ⊚ | ⊚ | ⊚ | ⊚ | ⊚ | ⊚ | O | O | ⊚ | ⊚ | ⊚ | ⊚ | ⊚ | O | (O) | O |

Examples 15 and 16 were acceptable for normal use, with no adhesive residue, but tended to have somewhat lower results for adhesive strength stability and releasability. This was attributed to the fact that the amount of multifunctional acrylate oligomers and/or monomer having double bonds was 240 weight parts and 5 weight parts, respectively, which were somewhat greater or lower than the range called for in the invention.

TABLE 2

| | Comparative Examples | | | | | | | | |
|---|---|---|---|---|---|---|---|---|---|
| | 1 | 2 | 3 | 4 | 5 | 6 | 7 | 8 | 9 |
| MW/C═C | | 217 | 217 | | 9000 | 200 | 9000 | 200 | 83 |
| Adhesive residue | none | 75% | 80% | none | none | none | none | 93% | 98% |
| Releasability | ⊚ | x | x | x | x | x | x | x | x |
| Adhesive Strength Stability | x | O | O | O | x | O | O | O | O |

This application claims priority to Japanese Patent Application No. 2007-000359. The entire disclosure of Japanese Patent Application No. 2007-000359 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An adhesive sheet for processing semiconductor substrates comprising a base film, where the base film is at least partially transmittable to radiation, wherein the radiation is selected from the group consisting of IR rays, x-rays, electron beams, and UV rays,
and an adhesive layer capable of being polymerized by radiation,
wherein the adhesive layer comprises a nonionic surfactant selected from the group consisting of a surfactant having an ester group, an ether group, a polyoxyethylene alkyl ether group, a polyoxyethylene alkyl phenyl ether group, and a polyethyleneglycol group and a multifunctional acrylate oligomer or monomer having a double bond, and is blended so as to result in a ratio of a total average molecular weight to a double bond of 225 to 7900 as determined on the basis of the weight average molecular weight of the multifunctional acrylate oligomer or the monomer having a double bond.

2. The adhesive sheet according to claim 1, wherein the adhesive layer includes a base polymer, and the multifunctional acrylate oligomer or monomer having a double bond is used in an amount of 10 to 180 parts per 100 weight parts of the base polymer.

3. The adhesive sheet according to claim 1, wherein the multifunctional acrylate oligomer or monomer having a double bond includes (meth)acrylate, urethane, polyether, polyester, polycarbonate, or polybutadiene oligomers.

4. The adhesive sheet according to claim 3, wherein the multifunctional acrylate oligomer or monomer having a double bond has a weight average molecular weight of 100 to 30,000.

5. An adhesive sheet for processing semiconductor substrates comprising a base film, where the base film is at least partially transmittable to radiation, wherein the radiation is selected from the group consisting of IR rays, x-rays, electron beams, and UV rays,
wherein the adhesive layer comprises a nonionic surfactant selected from the group consisting of a surfactant having an ester group, an ether group, a polyoxyethylene alkyl ether group, a polyoxyethylene alkyl phenyl ether group, and a polyethyleneglycol group and a multifunctional acrylate oligomer or monomer having a double bond, and is blended so as to result in a ratio of a total average molecular weight to a double bond of 225 to 7900 as determined on the basis of the weight average molecular weight of the multifunctional acrylate oligomer or the monomer having a double bond, wherein the ratio of a total average molecular weight to a double bond is determined by the following calculating formulas;
when one type of multifunctional oligomer or monomer being used $$M = (Mw/N_{dou}) \quad (1)$$

When two types of multifunctional oligomer or monomer being blended $$M = (Mw \text{ of } M1/N_{dou} \text{ of } M1) \times (Wp \text{ of } M1/\text{total } Wp \text{ of } (M1 \text{ and } O2)) + (Mw \text{ of } O2/N_{dou} \text{ of } O2) \times (Wp \text{ of } O2/\text{total } Wp \text{ of } (Mw \text{ and } O2)) \quad (2)$$

where M is the molecular weight relative to 1 double bond, Mw is the weight average molecular weight, $N_{dou}$ is the number of double bonds, M1 is the monomer, O2 is the oligomer, and Wp is the number of weight parts.

* * * * *